United States Patent [19]

Seki et al.

[11] Patent Number: 4,611,224
[45] Date of Patent: Sep. 9, 1986

[54] SEMICONDUCTOR RADIATION DETECTOR

[75] Inventors: Yasukazu Seki, Tokyo; Noritada Sato; Masaya Yabe, both of Kanagawa, all of Japan

[73] Assignees: Fuji Electric Corporate Research & Development Co., Ltd., Yokosuka; Fuji Electric Company, Ltd., Kawasaki, both of Japan

[21] Appl. No.: 640,659

[22] Filed: Aug. 14, 1984

[30] Foreign Application Priority Data

Aug. 26, 1983 [JP] Japan ................................ 58-156031

[51] Int. Cl.⁴ .............................................. H01L 27/14
[52] U.S. Cl. ................................... 357/30; 357/2; 357/61; 357/63
[58] Field of Search ................... 136/258 PC, 258; 357/59, 2, 4, 29, 30, 63, 61

[56] References Cited

FOREIGN PATENT DOCUMENTS 0060875 4/1982 Japan ................................ 357/2

OTHER PUBLICATIONS

H. Norda and P. A. Tove Vacuum, vol. No. 3, 201, (1977), "Behaviour of Amorphous Ge Contacts to Monocrystalline Silicon".

P. A. Tove, Physica Scripta, vol. 18,417, (1978), "Correlation between Barrier Heights and Electron and Hole Currents from Schottky Contacts to Silicon Radiation Detectors, and the Observation of Anomalously Low Hole Currents".

Primary Examiner—James W. Davie
Assistant Examiner—Georgia Y. Epps
Attorney, Agent, or Firm—Brumbaugh, Graves, Donohue & Raymond

[57] ABSTRACT

In the specific embodiments described in the specification, a semiconductor radiation detector has a single-crystal silicon substrate coated with an amorphous silicon film containing an impurity to widen the mobility band gap of the semiconductor to reduce the reverse bias leakage current. Phosphorus and carbon are disclosed as impurities for the amorphous silicon film.

3 Claims, 7 Drawing Figures

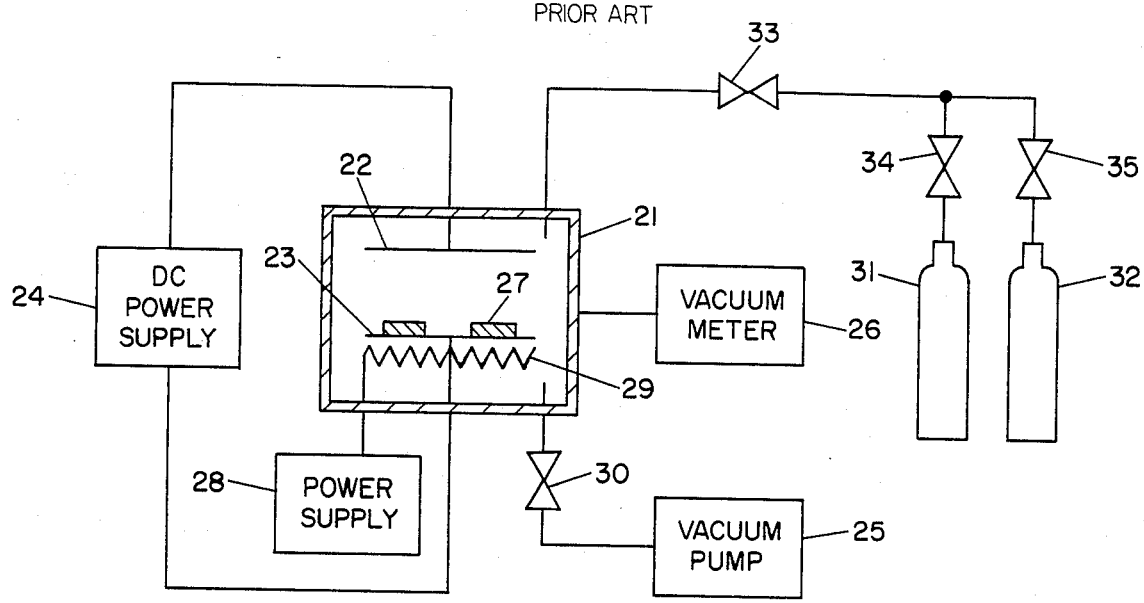

SEMICONDUCTOR RADIATION DETECTOR

BACKGROUND OF THE INVENTION

The present invention relates to a semiconductor radiation detector and, more particularly, to a new and improved semiconductor radiation detector having improved radiation detection efficiency.

Our prior copending application Ser. No. 613,890, filed May 24, 1984, discloses a semiconductor radiation detector comprising a substrate of single-crystal silicon, a hydrogen-added undoped amorphous silicon film deposited on the substrate, and metal electrodes deposited on the upper and lower surfaces of the substrate coated with the amorphous silicon film.

Since the hydrogen-added undoped amorphous silicon used in that arrangement has a fixed mobility band gap, however, the size of the energy barrier in the heterojunction of the single-crystal silicon and the hydrogen-added undoped amorphous silicon is uniquely determined. This imposes a limitation on the reduction of the reverse leakage current and also on the reduction of the noise level which can be obtained in that form of semiconductor radiation detector.

Accordingly, it is an object of the present invention to provide a semiconductor radiation detector in which the reverse leakage current is reduced and the radiation detecting efficiency is increased.

SUMMARY OF THE INVENTION

According to the present invention, a semiconductor radiation detector has an amorphous semiconductor containing an impurity to increase the mobility band gap of the semiconductor so as to provide a heterojunction having a wider energy barrier between the amorphous semiconductor and a single-crystal semiconductor, thereby reducing the reverse leakage current in the detector.

BRIEF DESCRIPTION OF THE DRAWINGS

Further objects and advantages of the invention will be apparent from a reading of the following description of specific embodiments in conjunction with the accompanying drawings, in which:

FIG. 1 is a schematic cross-sectional view of a prior semiconductor radiation detector;

FIG. 2 is a schematic cross-sectional view of an apparatus for fabricating a typical detector according to the present invention;

FIGS. 3 and 4 are schematic cross-sectional views showing different embodiments of the invention;

FIGS. 5 and 6 are schematic diagrams showing the energy distributions in heterojunctions of prior detectors and in detectors according to the present invention; and FIG. 7 is a schematic cross-sectional view of another embodiment of the present invention.

DESCRIPTION OF PREFERRED EMBODIMENTS

The semiconductor radiation detector disclosed in our copending application Ser. No. 613,890 has the construction shown in FIG. 1 of the accompanying drawings. That detector has a single-crystal substrate 1, a hydrogen-added undoped amorphous silicon film 2 deposited on the surface of the single-crystal silicon substrate, and metal electrodes 3 and 4 disposed on opposite surfaces of the detector. A reverse-biasing voltage is applied between the electrodes 3 and 4 to form a large energy barrier in the heterojunction between the silicon substrate 1 and the amorphous silicon film 2 so as to widen the depletion layer to trap and detect more of the incident radiation.

According to one embodiment of the invention, the substrate 1 is made of a p-type single silicon crystal, and an amorphous silicon film 2 is deposited on the surface of the single silicon crystal substrate by a plasma CVD process using a DC glow discharge, with phosphorus being incorporated into the amorphous silicon film.

Apparatus for preparing a detector according to the invention is schematically illustrated in FIG. 2. The apparatus includes a reaction chamber 21, discharge electrode plates 22 and 23, a DC power supply 24, a vacuum pump 25, a vacuum meter 26, a single silicon crystal 27, an electrode heater power supply 28, an electrode heater 29, an air flow control valve 30, a monosilane gas tank 31, a phosphine gas tank 32, and a gas flow control valve 33.

EXAMPLE 1

Using the apparatus shown in FIG. 2, a phosphorus-added amorphous silicon film is formed on the surface of a substrate of a single silicon crystal by a plasma CVD process under the following conditions:
(1) Single silicon crystal: resistivity 10 KΩ-cm, p-type;
(2) Substrate temperature: 200° C.;
(3) Gases used:
    (1) monosilane (diluted with 10% hydrogen)
    (2) phosphine (diluted with 1000 ppm hydrogen);
(4) Gas pressure: 10.0 Torr;
(5) Applied voltage: DC 400–800 V.

The phosphorus-added amorphous silicon produced under the foregoing conditions exhibits a strong n-type characteristic and forms a p-n heterojunction with the p-type surface of the single-crystal silicon substrate. The phosphorus-added amorphous silicon has a cross section as shown in FIG. 3, in which the film 38 is a film of phosphorus-added amorphous silicon. The arrangement thus formed is best suited for use in a simple radiation detector.

EXAMPLE 2

A substrate is made of a p-type single-crystal silicon, and an undoped amorphous silicon film is deposited on one principal surface of the substrate with a mask placed thereon by a plasma CVD process using a DC glow discharge under the following conditions:
(1) Substrate temperature 200° C.;
(2) Gas used: monosilane (diluted with 10% hydrogen)
(3) Gas pressure: 10.0 Torr;
(4) Applied voltage: DC 400–800 V.

Then the mask is removed, and a second mask is positioned to allow only the principal substrate surface to be exposed and a phosphorus-doped amorphous silicon film is deposited under the same conditions as those in Example 1. Metal electrodes are formed on the substrate and above the film.

FIG. 4 shows a cross-section of the construction thus fabricated in which an undoped amorphous silicon film 2 and a phosphorus-doped amorphous silicon film 38 are deposited on the crystal 1.

A radiation detector of the type illustrated in FIG. 4 has a radiation detecting efficiency which is 10 to 15% higher than that of Example 1 shown in FIG. 3 because of the presence of the undoped amorphous silicon film 2. Therefore, it is suitable for use as a semiconductor radiation detector having high resolution.

Examples 1 and 2 will now be considered from the standpoint of the energy distribution in the band gap.

FIG. 5 represents the energy diagram of a prior semiconductor radiation detector showing a conduction band CB, a valence band VB, a Fermi level $E_F$, an electron 50, and a hole 51. As illustrated in FIG. 5, the application of a reverse-biasing voltage increases the energy barriers for the electron 50 and the hole 51, respectively, with the result that leakage current is reduced. FIG. 6 represents the energy diagram for a construction in which a phosphorus-added amorphous silicon film is formed on the surface of a single silicon crystal, that is, the arrangement of Examples 1 and 2, in which the symbols CV, VB, $E_F$, 50 and 51 have the same meanings as those in FIG. 5. The single-crystal silicon substrate is the same as that of FIG. 5.

With phosphorus added to the amorphous silicon, the Fermi level $E_F$ is shifted toward the conduction band as shown in FIG. 6. Therefore, the heterojunction has an energy barrier higher than that of the prior detector construction shown in FIG. 5. Since the energy barrier becomes even higher by applying a reverse bias, the leakage current is reduced. For the purpose of increasing the height of the energy barrier, single-crystal silicon of a stronger p-type may be used and amorphous silicon of a strong n-type may also be used.

EXAMPLE 3

A substrate is made of a p-type single silicon crystal, and an amorphous silicon film is deposited on the surface of the single silicon crystal substrate by a plasma CVD process using a DC glow discharge, with carbon incorporated into the amorphous silicon.

The fabrication apparatus used is substantially the same as that shown in FIG. 2 except that a methane gas tank is used in place of the phosphine tank 32.

Using that apparatus, a carbon-added amorphous silicon film is formed on the surface of the substrate of single-crystal silicon by a plasma CVD process under the following conditions:
(1) Single silicon crystal: resistivity 10 KΩ cm, p-type;
(2) Substrate temperature: 200° C.;
(3) Gases used:
    (1) monosilane (diluted with 10% hydrogen)
    (2) methane (diluted with 10% hydrogen);
(4) Gas pressure 10.0 Torr;
(5) Applied voltage: DC 400–800 V.

The carbon-added amorphous silicon fabricated by the plasma CVD process under the above conditions has a mobility band gap wider than that of the undoped amorphous silicon employed in the prior detector. Therefore, a reverse leakage current across the heterojunction between the carbon-added amorphous silicon and the single-crystal silicon is 10% or more lower than that of the prior detector shown in FIG. 1. As a result, the detecting efficiency is 15% or more higher than that of the prior detector. The semiconductor radiation detector of this Example has the construction shown in FIG. 7, in which a p-type single silicon crystal 1 has metal electrodes 3 and 4, and is coated with a carbon-added amorphous silicon film 70.

In the above Example, the ratio of flow rates of monosilane and methane gases is 3 to 7. However, the mobility band gap of the amorphous silicon may also be increased using a different gas flow ratio to change the proportions of the gases. Similarly, a silicon carbide layer may be employed instead of the amorphous silicon by using a different gas flow ratio.

It is also possible to use only methane gas with no monosilane and to employ amorphous carbon rather than amorphous silicon.

For the purpose of widening the mobility band gap of the amorphous silicon, it is also possible to form an amorphous silicon film using a plasma CVD process with oxygen and nitrogen added to monosilane. An arrangement in which a p-type amorphous silicon film is deposited on n-type single-crystal silicon is also effective.

In accordance with the present invention, therefore, the reverse leakage current can be reduced simply by adding an impurity to undoped amorphous silicon of the type used in prior semiconductor radiation detectors, with the result that a radiation detecting efficiency can be increased by 10% or more.

We claim:

1. A semiconductor radiation detector comprising:
   a semiconductor bulk region of a first conductivity type having a principal surface;
   a first amorphous semiconductor layer of a second conductivity type formed on a first portion of the principal surface of the bulk region;
   a second armorphous semiconductor layer formed on a second portion of the principal surface surrounding the first portion, the second amorphous layer being substantially undoped;
   a first electrode in electrical contact with the bulk region; and
   a second electrode in electrical contact with the first amorphous layer.

2. A semiconductor radiation detector according to claim 1, wherein the bulk semiconductor region is p-type single crystal silicon, and the first amorphous layer is silicon and doped with an impurity selected from the group consisting of phosphorus and carbon.

3. A semiconductor radiation detector according to claim 1, wherein the first amorphous layer is selected from the group consisting of amorphous silicon, amorphous silicon carbide and amorphous carbon.

* * * * *